United States Patent [19]
Karabatsos

[11] Patent Number: 5,949,657
[45] Date of Patent: Sep. 7, 1999

[54] BOTTOM OR TOP JUMPERED FOLDABLE ELECTRONIC ASSEMBLY

[76] Inventor: Chris Karabatsos, 42 Jumping Brook La., Kingston, N.Y. 12401

[21] Appl. No.: 09/139,190

[22] Filed: Aug. 25, 1998

Related U.S. Application Data

[60] Provisional application No. 60/067,116, Dec. 1, 1997.

[51] Int. Cl.⁶ .................................. H05K 1/11; H05K 1/14
[52] U.S. Cl. ............................ 361/803; 361/736; 361/744; 439/74; 439/493; 174/254
[58] Field of Search ................................ 361/736, 737, 361/740, 744, 748, 749, 750, 751, 784, 785, 789, 790, 801–803; 439/67, 74, 493, 591, 629; 174/254, 267, 268; 257/686, 723, 724

[56] References Cited

U.S. PATENT DOCUMENTS

| | | | |
|---|---|---|---|
| 3,221,286 | 11/1965 | Fedde | 439/67 |
| 4,700,880 | 10/1987 | Glover | 228/180.1 |
| 5,070,258 | 12/1991 | Izumi et al. | 327/565 |
| 5,220,488 | 6/1993 | Denes | 174/254 |
| 5,224,023 | 6/1993 | Smith et al. | 439/67 |
| 5,283,712 | 2/1994 | Michihira et al. | 361/785 |
| 5,428,190 | 6/1995 | Stopperan | 174/254 |
| 5,523,695 | 6/1996 | Lin | 439/493 |
| 5,709,557 | 1/1998 | Martin et al. | 439/74 |
| 5,754,409 | 5/1998 | Smith | 439/67 |

Primary Examiner—Leo P. Picard
Assistant Examiner—John B. Vigushin
Attorney, Agent, or Firm—Mark P. White

[57] ABSTRACT

An electronic assembly is made up of a number of rigid manufactured on the same or different substrates or panels and with the same materials separated from each other electrically and physically. One of the rigid circuit boards has a comb of printed tabs, or fingers, at the edge, which connects the assembly physically and electrically to a motherboard. Flexible wire jumpers bridges the comb to form electrical connections between the boards. Both boards have printed circuit tabs placed in alignment to each other on both boards across a gap which separates both boards. These tabs facilitate electronic interconnection of both boards via the flexible jumpers, which are groups or clusters of wires separated from each other via a flexible insulator. A method for manufacturing the assembly is also disclosed, in which two boards are created by cutting gaps from a substrate, leaving the two boards separated by a gap and connected by snap-offs. Once all the intended electronic components and the flexible jumpers are soldered onto the boards, the boards are rotated, snapping them apart. After a desirable spacing between components of both boards is achieved, both boards are pinned together to maintain achieved proximity.

11 Claims, 3 Drawing Sheets

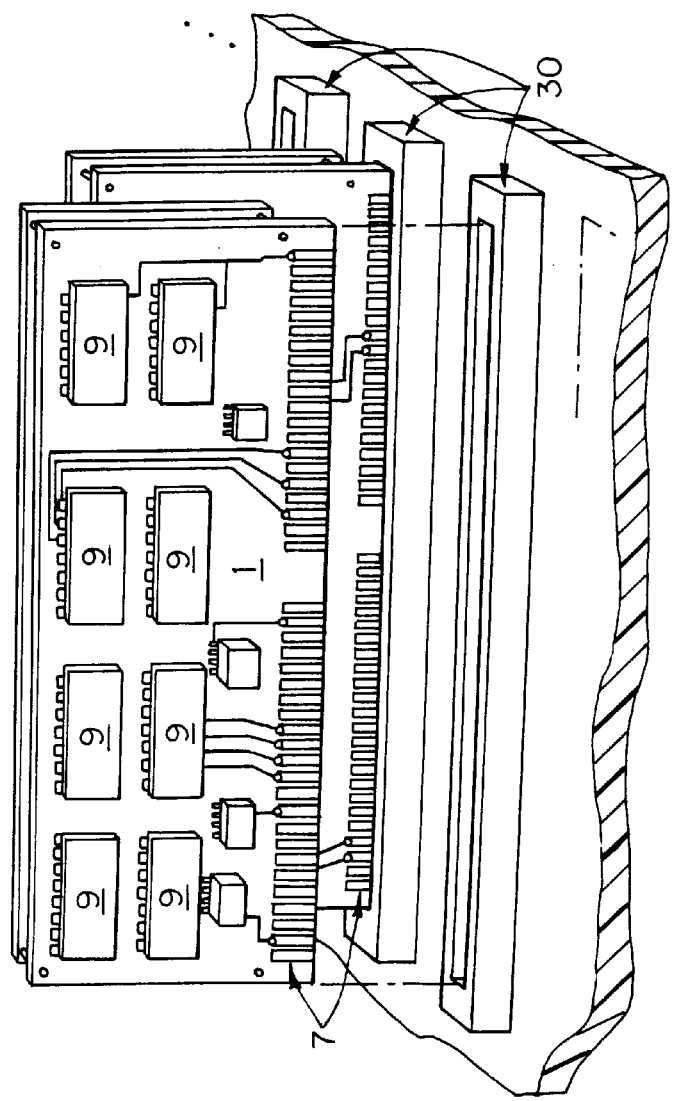
FIG. 5
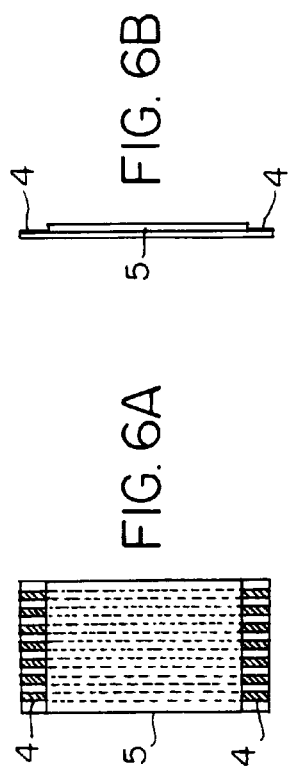
FIG. 6A
FIG. 6B
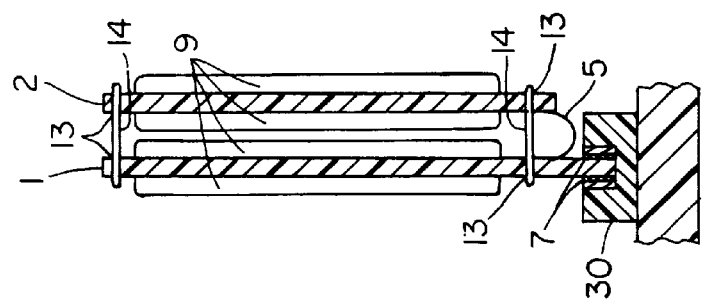
FIG. 4
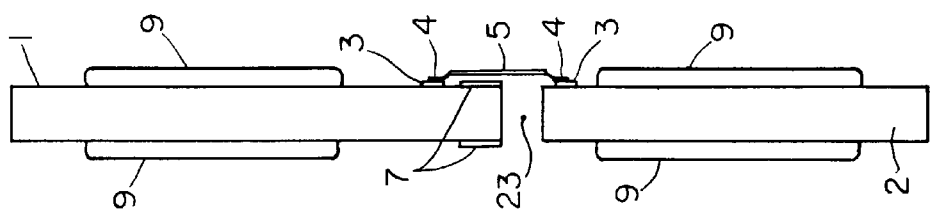
FIG. 2

BOTTOM OR TOP JUMPERED FOLDABLE ELECTRONIC ASSEMBLY

PROSECUTION HISTORY

This application claims priority based on the filing of provisional application filed on Dec. 1, 1997, application Ser. No. 60/067,116.

FIELD OF THE INVENTION

This invention relates to electronic circuit packaging, and more specifically to the packaging of integrated circuit chips in the form of electronic modules made up of multiplicities of parallel-positioned printed circuit boards attached into a single rigid structure, containing the chips mounted in high density arrays, and with high-speed electrical interconnections between the boards by means of jumpers constructed of flexible or semi-flexible material containing a number of conducting wires.

DESCRIPTION RELATIVE TO THE PRIOR ART

Designers of electronic circuits are forever striving to reduce the size of electronic assemblies through miniaturization of the electronic components to achieve high density and high frequency operation. Space utilization is enhanced by using modules of low physical profile and of high density of electronic components.

Modules containing high-speed memory chips, such as SDRAMS, RDRAMS, FLASH, and SRAMS, Logic Chips, or any combination thereof, are typically interconnected by mounting to a motherboard via connectors. These modules require both the grouping of arrays of integrated circuit chips in close proximity, and the electrical interconnection of those chips with each other through short, high-speed paths. Furthermore, the mating connectors on the motherboard must support the modules mechanically, as well as providing electrical connectivity.

The packaging configuration must typically be flexible enough to allow expansion of the memory capacity by addition or substitution of memory modules. However, space considerations often dictate a limitation in the amount of expansion possible. Furthermore, cooling also becomes a problem when the density of electronic components becomes very high.

There is a need for an improved packaging technique which would provide for the convenient expansion of the memory without requiring a large space allocation for memory modules in the basic configuration, and yet would fit into pre-existing physical spacing of supporting structures, such as connectors, of the motherboard. High density of components, and high-speed connectivity are characteristics that cannot be compromised in such an improved configuration.

Thus, what is required is a packaging technique for assembling memory modules in a compact arrangement which does not require substantial space allocation for future expansion, which provides a configuration which can be easily cooled with essentially the same techniques already used in these systems, and which does not degrade the performance of the memory chips.

This objective is achieved by combining a number of printed circuit boards of substantially the same size, bonded to a common flexible interconnecting arrangement of flexible jumpers of predetermined length and spacing. The jumpers are made up of conducting wires that are formed together into a parallel array, the wires bonded into a sheet with non-conducting material between each wire.

An alternate method of jumper construction involves the arrangement of flexible or semi-rigid material with conductive foil on both sides. This foil is usually copper but need not be restricted to copper. Then the wires are etched to form the parallel array arranged in groups to form the jumper assembly.

One or more of the printed circuit boards has an edge connector in the form of a comb of printed connector tabs, arranged on one end of the rigid exposed area away from the electronic components to provide interconnection of the components on the module with a motherboard. The connection is typically made by means of a female connector physically affixed to, and electrically connected with, the motherboard. This connector performs the functions of both electrically connecting the module with the motherboard, and physically supporting the module.

In the prior art each module was made up of a single substrate, with chips on one or both sides, and a female connector for each such module located on the motherboard. In the present invention, however, the module is made up of two or more substrates, each mounted substantially parallel to the other substrates on the same module, and each substrate affixed to the other substrates, forming a single rigid structure. The method of affixing the substrates to the module is typically done by metal posts, which pass through the substrates at the perimeter of the substrates, and are attached by soldering or mechanical fastening. The spacing between adjacent boards is maintained such that a passageway between the boards is maintained sufficient to allow cooling air to circulate.

This arrangement lends itself to easy manufacturing of the modules in cases where the module consists of two boards. The two boards are originally manufactured as a single board assembly, connected by narrow snap-offs. Each board contains jumper tabs placed in alignment to each other across the gap that separates the two boards. These jumper tabs facilitate electronic interconnection of both boards via the flexible jumpers, which are groups or clusters of wires separated from each other via a high-dielectric, heat resistant, flexible insulator such as KAPTON or ACRYLIC, which is bonded to the wires. The ends of the jumper wires are exposed and treated so that they can be soldered onto the tabs on both boards.

The jumpers not only provide a short path between components, but also provide conductivity with low capacitance between conductors because of the jumper construction, with a large, uniform distance between conductors, maintained by a high dielectric material.

Manufacture of this configuration begins with a single, flat piece of printed circuit substrate, with channels or gaps cut to facilitate later separation into two separate boards. The components and the jumpers are mounted on this single, flat substrate. This allows the use of standard manufacturing techniques, such as pick and place surface mounting and solder reflow.

Once all the intended electronic components and the flexible jumpers are soldered onto the two-board assembly, the boards are liberated from the larger printed circuit board by snapping off the holding portions and are forcibly rotated into a position parallel to each other, with the components of each board on the side facing the other board.

After a desirable spacing between components of both boards is achieved, both boards are pinned together with posts to maintain achieved proximity. The posts are soldered or fastened to each board, forming a rigid structure.

This technique is particularly indicated for high-density applications such as memory modules. The short wire lengths and low inter-conductor capacitance provided by this technique are required for high speed DATA BUS in the 100 MHz frequency range and above.

SUMMARY OF THE INVENTION

It is the general object of this invention to provide a high-density packaging configuration for use in computer memory systems. It is a further general object of this invention to alternatively provide such a packaging configuration without sacrificing speed of access of the memory. It is a specific object of this invention to provide such high speed configuration by means of a multi-circuit board array, wherein the interconnection between boards is made by arrays of conductors in the form of jumpers having high conductivity and low inter-conductor capacitance.

According to one aspect of the invention, an electronic assembly includes at least two laminarly formed circuit boards, each of which has a multiplicity of jumper pads, conductive leads and connecting stations applied thereto. Each board has a first face and a second face, which are parallel to each other. All the circuit boards are located in a parallel relationship to the other boards, and one or more flexible jumper assemblies are provided, each of which contains a multiplicity of conductors, each conductor having a first end and a second end. The first end of each jumper is bonded to pads on the first face of a circuit board, and the second end is bonded to pads on the second face of the adjacent circuit board. A comb of conducting contacts etched onto at least one edge of at least one of the boards. Means are provided for maintaining the boards in a configuration parallel to each other, so that electronic signals may travel from any board in the array to an adjacent board.

According to a second aspect of this invention, the means for maintaining the boards in a parallel configuration has a multiplicity of posts, each of which have a first end and a second end. The first end of each post is rigidly affixed to the first face, while the second end is rigidly affixed to the second face.

According to a second aspect of this invention each board contains at least one post via, with each post via sized dimensioned to accommodate passage of at least one post. The post vias on adjacent boards are aligned to accommodate the posts, and each post is affixed to adjacent boards by soldering.

According to yet another aspect of the invention, the assembly includes means for cooling the assembly, namely, maintaining spacing between adjacent boards such that cooling air may freely circulate between said adjacent boards.

According to still another aspect of the invention, the jumpers includes a body and lead contacts, where the body is made of a material selected from the group consisting of KAPTON and ACRYLIC.

According to yet another aspect of the invention, a method for manufacturing the electronic module from a printed circuit substrate includes the steps of etching jumper pads, circuit pads, circuit vias, post vias, and a connector comb onto the substrate, cutting a multiplicity of gaps into the substrate, separating the substrate into a frame, an upper board, and a lower board, with the areas being joined by a multiplicity of snap-offs. The method next includes mounting the electronic components onto the boards, and then mounting a multiplicity of jumpers, the jumpers including an array of wires with upper ends and lower ends, the upper end mounted to pads on the upper board, and the lower end mounted to pads on the lower board. Following these steps are the steps of soldering the electronic components and jumpers to the boards, breaking the snap-offs, so that the two boards are free of the frame, rotating the boards until they are parallel to each other, inserting posts through the post vias, and affixing the posts to the post vias.

According to a final aspect of the invention, the attachment of the posts to the post vias is by means of soldering.

BRIEF DESCRIPTION OF THE DRAWINGS

These, and further features of the invention, may be better understood with reference to the accompanying specification and drawings depicting the preferred embodiment, in which:

FIG. 2 is a cross section view of the memory module of FIG. 1.

FIG. 4 depicts a cross-section view of the memory module of FIG. 1 after completion of the manufacturing process.

FIG. 5 depicts a perspective view of the memory module of FIG. 1, after completion of the manufacturing process.

FIG. 6a depicts a plan view of the jumper used in all the preferred embodiments.

FIG. 6b depicts a side view of the jumper used in all the preferred embodiments.

DESCRIPTION OF THE PREFERRED EMBODIMENTS OF THE INVENTION

Figure 1:
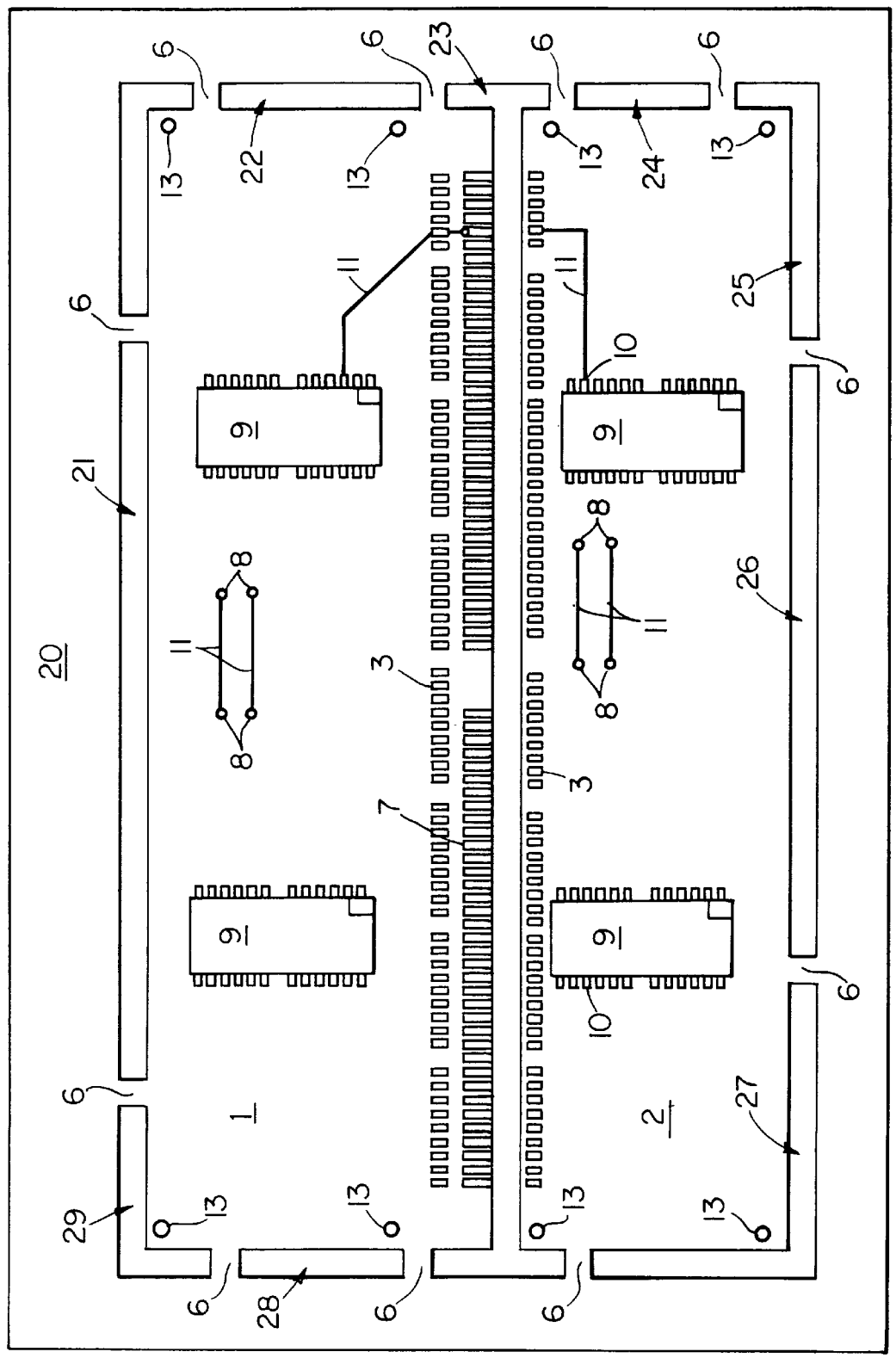
FIG. 1 depicts a plan view of a memory module in the first stage of manufacturing, in accordance with the first preferred embodiment.

Referring now to FIG. 1, a top view of a memory module assembly is depicted as it appears after the first stage of manufacturing. The entire base structure as seen in FIG. 1 was formed by die-cutting from a single piece of substrate. This substrate may be either a two-sided printed circuit substrate, or a multi-layer substrate. The manufacturing process used to produce such a substrate is well known and is a mature technology, and will not be described herein. The channels, or gaps 21 through 29, inclusive, are cut, leaving snap-offs 6 to connect the outer frame 20 to the module boards 1 and 2. The size of the snap-offs may vary.

The gaps are typically formed by routing. They must be wide enough to allow use of available mechanical means to perform such routing operation. Forming of the gaps can also be performed by laser cutting, or by etching methods.

The gap dimension is critical in order to provide a geometry which allows for minimum jumper wire length. The jumper length must be sufficiently long to bridge the edge-connector fingers used to mount the final assembly to the connector. Allowance must also be made for soldering the jumper ends to the pads.

Also shown on this figure are chips 8 which have been affixed to the board physically and electrically by soldering, the comb 7 of contacts etched on both sides at the edge which make up the edge connector intended to mate with the female connector on the motherboard, and the arrays of pads 3 used to affix the jumpers to the board physically and electrically by means of soldering.

Also shown are circuit vias 8, as well as printed wires 11 that interconnect various circuits within layers of the boards that make them functional.

There are distinct from the post vias 13 that are used to line up the two rigid board sections when folded. Through said post vias 13 a post 14 is inserted and soldered on each rigid section. Such post 14 holds the two rigid sections together in a specified separation distance. Such posts are not restricted to solderable types. They may be of a mechanical nature, such as screws or rivets.

The perimeter of the boards are routed out except in strategic locations where small sections 6, snap-offs, are left to hold both boards the proper distance from each other. The board sections are scored so that they can be easily removed after the soldering process in order to separate the boards 1 and 2 from the frame 20. The board sections may also be routed out by a routing machine after the soldering process.

The electronic components 9 and the flexible jumpers 5 are placed on the boards before the boards are separated from the frame, either with a pick-and-place machine or by hand. Then the whole panel, including frame 20 and boards 1 and 2, is processed through a solder re-flow oven to solder the components on the boards.

The vias 13 are plated-through holes drilled through the boards 1 and 2, through which the posts 14 (not shown in FIG. 1) will be inserted.

Referring next to FIG. 6a, the jumper is seen to consist of a body 5 from which the contact pins 4 appear on opposite sides, forming an array of conductive wires electrically isolated from each other. Thus, the left-most top contact pin of the jumper is electrically connected to the left-most bottom contact pin, and is further electrically isolated from all the other contacts.

Referring now to FIG. 6b, the side view of the jumper discloses a very thin material, which is flexible and allows substantial bending of the jumper material without diminishing the electrical conductivity of the individual conductors.

The flexible jumpers 5 are thus clusters of conductive wires of desirable length, width and height, are typically for rectangular in shape or rounded to a desirable diameter, and held together with a high-dielectric, heat resistant, flexible insulating material such as KAPTON or ACRYLIC, having the ends of both sides of each wire in the cluster exposed and treated for soldering.

It is important that the insulating material is high dielectric, so as to minimize inter-conductor capacitance and therefore provide a high-speed signal path through the jumpers. The temperature-resistance is important to allow the jumpers to be soldered in place by conventional techniques without damage to the jumpers. Flexibility is important since the jumpers will be bent into "U" shapes as the manufacturing process proceeds. This "U" shape bend may be seen by referring to FIG. 4, which shows the bent jumper 5.

The contacts 4 are spaced precisely to align with etched jumper pads 3 of both boards and prepared for soldering to the designated jumper pads that are precisely aligned on both boards. The jumpers are the only means of electrically interconnecting the boards, and to connect the combs 3 of either side to electronic components on board 2.

The jumpers are quite short, and it should be apparent from FIG. 4 that the jumpers provide a minimum-distance interconnection between adjacent boards. Furthermore, the construction of the jumper is such that a constant distance between adjacent wires in the jumper array is maintained, as can be seen by referring to FIG. 6a. The material from which the body of the jumper is made is generally of a high dielectric constant as well. The result is that inter-conductor capacitance is also minimized, further enhancing propagation signal speed across the jumpers.

Referring next to FIG. 2, it may be seen that the frame 20 has been snapped away from the boards 1 and 2, fracturing the snap-offs 6. FIG. 2 also depicts the jumpers attached to the boards, with the contacts 4 soldered onto the pads 3.

Referring to FIG. 4, the boards have been rotated, clockwise as to the top board of FIG. 2, and anti-clockwise as to the bottom board, so that the comb 7 extends freely downward and is available to insert into female connector 30. The posts 14 have been inserted through the vias 13, soldering the posts into the vias converts the entire combination into the final module assembly and related wiring as a rigid module.

After the soldering process, the boards with the components 9 and other decoupling capacitors on them held together with the flexible jumpers are separated from the panel or sub-panel by breaking away the snap off sections.

Note that, in the final assembly configuration the gap between the two parallel edges of the boards is wide enough to allow soldered, integrated components to ventilate, and to allow mounting of the assembled boards in a parallel, face-to-face layered arrangement of supporting structures. Ventilation is critical for the purpose of cooling the module. Proper spacing is determined by empirical methods. It has been found that adjacent boards should be separated sufficiently so that the chips and other components mounted thereon do not touch, but rather allow cooling air to pass between the components.

FIG. 5 depicts a perspective view of the completed assembly of the first preferred embodiment, showing how the edge connector comb 7 mates into the female connector 30 of the motherboard.

Figure 3:
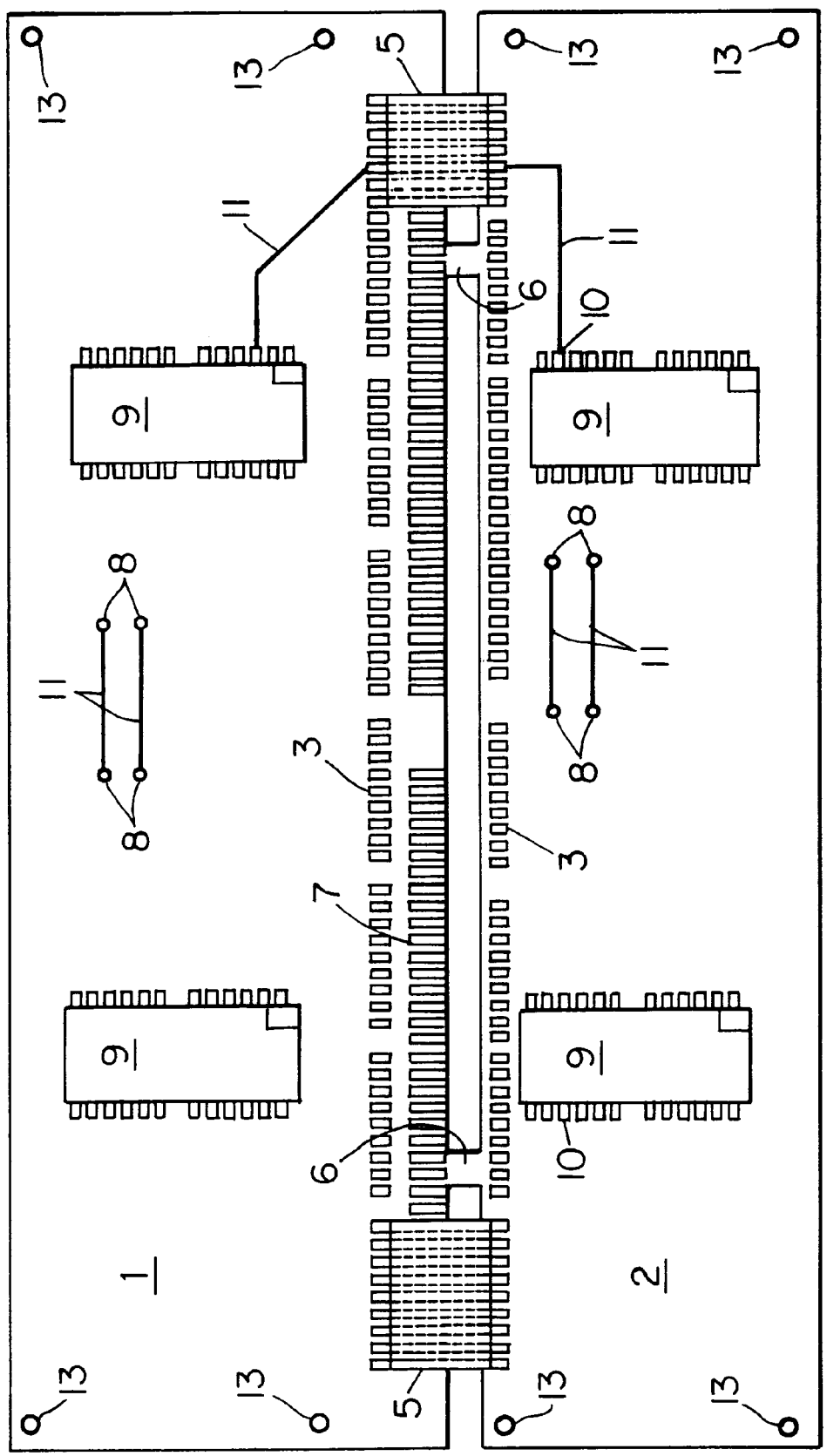
FIG. 3 depicts a plan view of a memory module in the first stage of manufacturing, in accordance with the second preferred embodiment.

In a second preferred embodiment, the boards are manufactured without using a frame to support the structure in the initial stages of manufacturing. Referring to FIG. 3, the snap-offs 31 only extend between the boards 1 and 2 in the vicinity of the comb 3. Not only does the second preferred embodiment require less material and produce less waste (i.e. the frame), but separating boards 1 and 2 is much easier, as there are only two snap-offs, and rotating the boards along the axis of the comb is sufficient to break the snap-offs. The resulting completed assembly is identical to that of the first preferred embodiment.

It will be apparent that improvements and modifications may be made within the purview of the invention without departing from the scope of the invention defined in the appended claims.

What is claimed:

1. An electronic assembly intended to interface with one or more female edge connectors on a motherboard, which comprises:

at least two circuit boards of printed-circuit substrate, each having a first and second face, and each of which further comprises a multiplicity of jumper pads applied thereto;

one or more flexible jumper assemblies, each of which comprises a multiplicity of conductors, each conductor having a first end and a second end, the first end of which is electronically connected to the jumper pads on the first face of one of the circuit boards, and the second end of which is electronically connected to the jumper pads on the second face of the adjacent circuit board;

a comb of conducting contacts on at least one edge of at least one of the circuit boards which matingly engages with one of the female edge connectors on the motherboard, and on which circuit boards the jumper pads are in close proximity to the comb of conducting contacts; and means for maintaining the circuit boards substantially parallel to each other, and, as to adjacent circuit boards, opposingly facing each other, wherein the jumper assemblies are made as short as possible, and wherein electronic signals may travel, with high speed and low signal degradation, from any board in the array to any adjacent boards.

2. The electronic assembly of claim 1, wherein, for each pair of adjacent circuit boards, the first face of one board of the pair opposingly faces the second face of the other board.

3. The assembly of claim 1, wherein the means for maintaining the circuit boards substantially parallel to each other further comprises a multiplicity of posts, each of which has a first end and a second end, the first end of which is rigidly affixed to the first face of a board, and the second end of which is rigidly affixed to the second face of an adjacent board.

4. The assembly of claim 3, wherein each board further comprises at least one post via, each post via of dimension sufficient to accommodate passage of at least one post through said post via, wherein the post vias on adjacent boards are aligned to accommodate said posts, and wherein each post is affixed to adjacent boards by soldering.

5. The assembly of claim 4, further comprising circuit pads located on the boards which are sized, dimensioned and positioned to electronically engage components mounted thereupon.

6. The assembly of claim 5, wherein spacing between boards is such that the components mounted thereupon are not in contact with the components mounted on adjacent boards.

7. The assembly of claim 6, which further comprises means for cooling said assembly.

8. The assembly of claim 7, whereas the means for cooling further comprises maintaining the spacing between adjacent boards such that cooling air may freely circulate between said adjacent boards.

9. The assembly of claim 8, wherein electronic chips are mounted on both sides of the boards.

10. The assembly of claim 9, wherein the components comprise memory chips selected from the group consisting of SDRAMS, RDRAMS, FLASH, and SRAMS.

11. The assembly of claim 10, wherein each jumper assembly further comprises a body in which said conductors are embedded, and wherein the body is made of a material which is flexible, heat resistant, and of a high-dielectric constant.

* * * * *